United States Patent
Willmeroth et al.

(10) Patent No.: US 8,901,623 B2
(45) Date of Patent: Dec. 2, 2014

(54) SUPER JUNCTION SEMICONDUCTOR DEVICE WITH OVERCOMPENSATION ZONES

(71) Applicant: Infineon Technologies Austria AG, Villach (AT)

(72) Inventors: Armin Willmeroth, Augsburg (DE); Franz Hirler, Isen (DE); Uwe Wahl, Munich (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/769,630

(22) Filed: Feb. 18, 2013

(65) Prior Publication Data
US 2014/0231904 A1  Aug. 21, 2014

(51) Int. Cl.
  H01L 29/66  (2006.01)
  H01L 21/8238  (2006.01)

(52) U.S. Cl.
  USPC ........................................... 257/262; 438/228

(58) Field of Classification Search
  USPC .......... 438/151, 197, 224, 228; 257/262, 371, 257/E29.255–E29.313
  See application file for complete search history.

(56) References Cited

U.S. PATENT DOCUMENTS

| | | | |
|---|---|---|---|
| 6,201,279 B1 * | 3/2001 | Pfirsch | 257/333 |
| 6,630,698 B1 * | 10/2003 | Deboy et al. | 257/285 |
| 7,259,426 B2 * | 8/2007 | Aida et al. | 257/341 |
| 7,868,384 B2 | 1/2011 | Lee et al. | |
| 7,936,010 B2 | 5/2011 | Zundel et al. | |
| 2010/0136774 A1 | 6/2010 | Schulze et al. | |

FOREIGN PATENT DOCUMENTS

| | | |
|---|---|---|
| DE | 19840032 C1 | 11/1999 |
| DE | 10120656 C2 | 10/2002 |
| DE | 1020080039845 A1 | 3/2009 |

\* cited by examiner

Primary Examiner — Calvin Lee
(74) Attorney, Agent, or Firm — Murphy, Bilak & Homiller, PLLC

(57) ABSTRACT

According to an embodiment, a super junction semiconductor device may be manufactured by introducing impurities of a first impurity type into an exposed surface of a first semiconductor layer of the first impurity type, thus forming an implant layer. A second semiconductor layer of the first impurity type may be provided on the exposed surface and trenches may be etched through the second semiconductor layer into the first semiconductor layer. Thereby first columns with first overcompensation zones obtained from the implant layer are formed between the trenches. Second columns of the second conductivity type may be provided in the trenches. The first and second columns form a super junction structure with a vertical first section in which the first overcompensation zones overcompensate a corresponding section in the second columns.

11 Claims, 13 Drawing Sheets

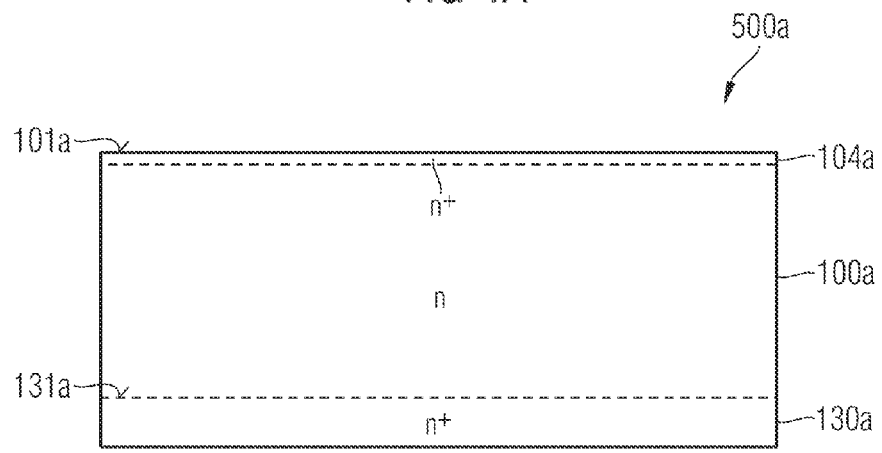
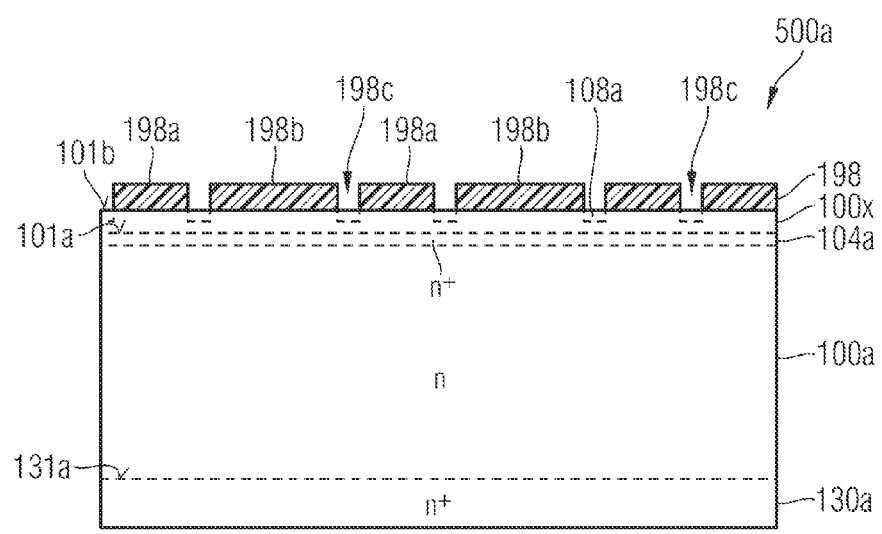

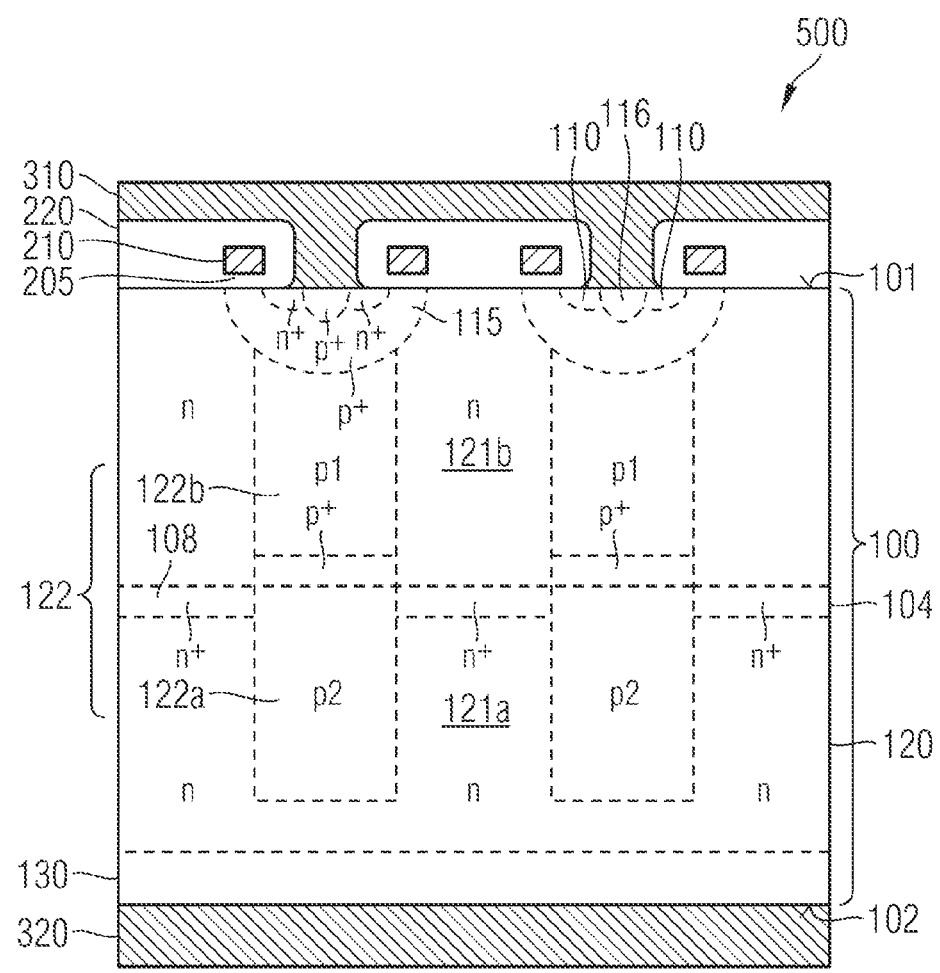

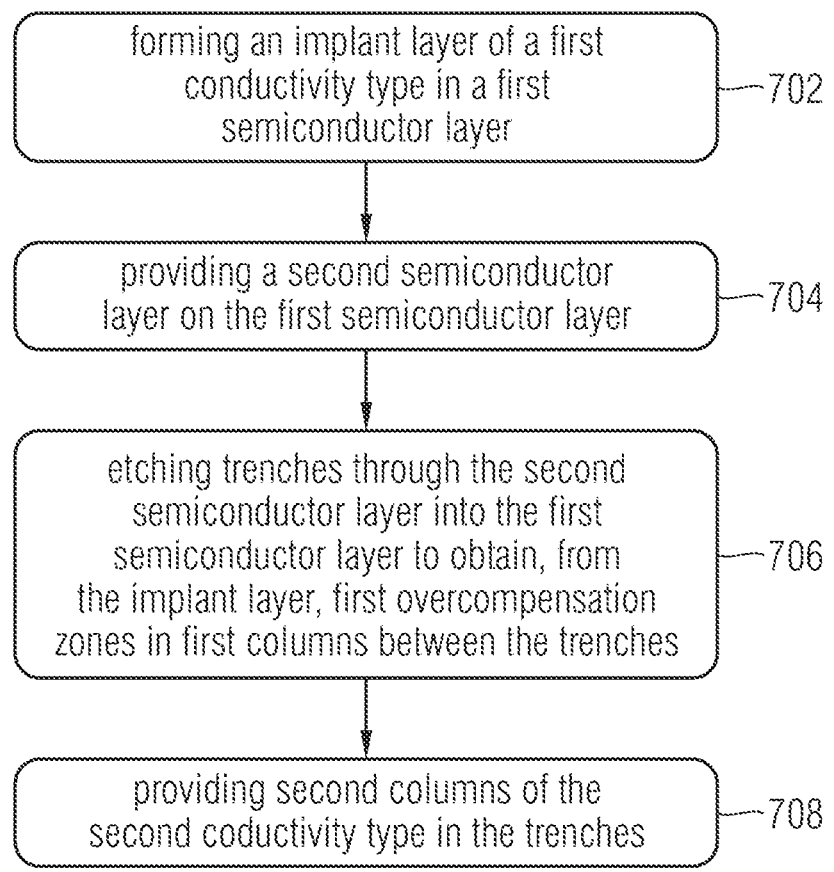

SUPER JUNCTION SEMICONDUCTOR DEVICE WITH OVERCOMPENSATION ZONES

BACKGROUND

A semiconductor portion of a super junction n-FET (field effect transistor) includes an n-type drain layer and a drift layer with p-doped columns separated by n-doped columns. In the reverse mode depletion zones extend between the p-doped and n-doped columns in a lateral direction such that a high reverse breakdown voltage is achieved even at high impurity concentrations in the n-doped columns ensuring a low on-state resistance. A compensation rate may vary in the vertical direction of the columns to improve the avalanche characteristics of the device. It is desirable to provide super junction semiconductor devices and methods of manufacturing super junction semiconductor devices with improved avalanche characteristics.

SUMMARY

According to an embodiment a super junction semiconductor device is manufactured by introducing impurities of a first impurity type into an exposed surface of a first semiconductor layer of the first impurity type, wherein an implant layer is formed. A second semiconductor layer of the first impurity type is provided on the exposed surface and trenches may be etched through the second semiconductor layer into the first semiconductor layer. Between the trenches first columns with first overcompensation zones obtained from the implant layer are formed. In the trenches second columns of the second conductivity type are provided. The first and second columns form a super junction structure with a vertical first section in which the first overcompensation zones overcompensate a corresponding section in the second columns.

Another embodiment refers to a super junction semiconductor device with a super junction structure formed in a semiconductor portion. The super junction structure includes first columns of a first conductivity type and second columns of a second conductivity type opposite to the first conductivity type. The second columns separate neighboring first columns from each other and extend in a vertical direction perpendicular to a first surface of a semiconductor portion. The first columns have non-undulated sidewalls. In a vertical first section of the super junction structure impurities of the first conductivity type overcompensate impurities of the second conductivity type.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 4A is a cross-sectional view of a portion of a semiconductor substrate for illustrating a method of manufacturing a super junction semiconductor device in accordance with an embodiment providing first and second overcompensation zones in the same columns after providing an implant for the first overcompensation zones.

FIG. 4B is schematic cross-sectional view of the portion of the semiconductor substrate of FIG. 4A after providing an implant for second overcompensation zones.

FIG. 6A is a schematic cross-sectional view of a portion of a semiconductor device in accordance with an embodiment providing first and second overcompensation zones in different columns and super junction sections of different compensation rates.

FIG. 7 is a simplified flowchart referring to a method of manufacturing a super junction semiconductor device in accordance with a further embodiment.

DETAILED DESCRIPTION

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
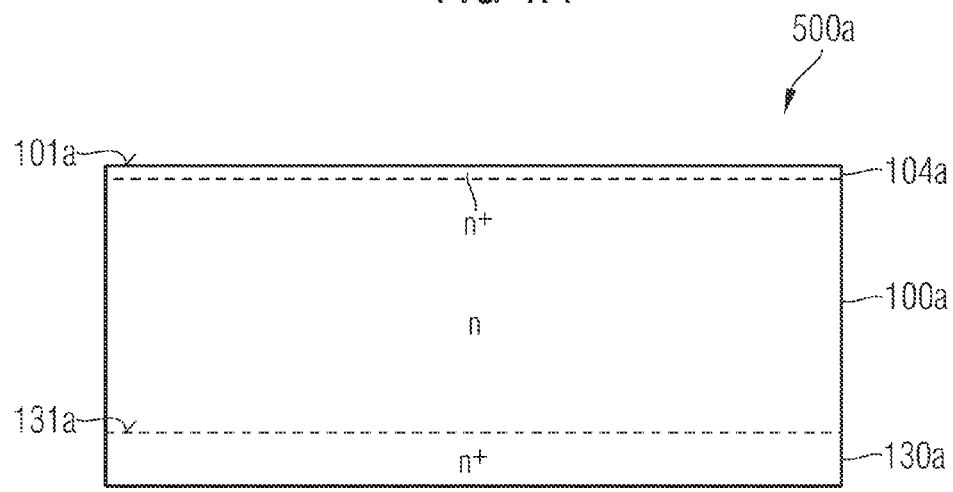
FIG. 1A is a cross-sectional view of a portion of a semiconductor substrate for illustrating a method of manufacturing a super junction semiconductor device in accordance with an embodiment providing overcompensation zones in trenches after forming an implant layer for first overcompensation zones.
Figure 1B:
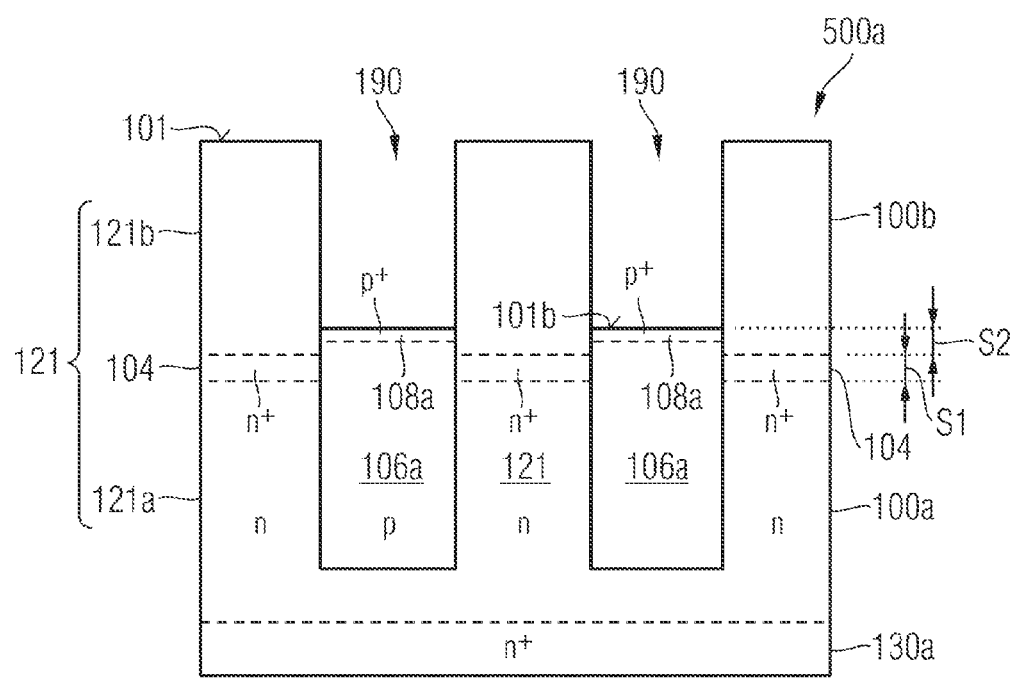
FIG. 1B is a cross-sectional view of the portion of the semiconductor substrate of FIG. 1A after providing implants for second overcompensation zones.
Figure 1C:
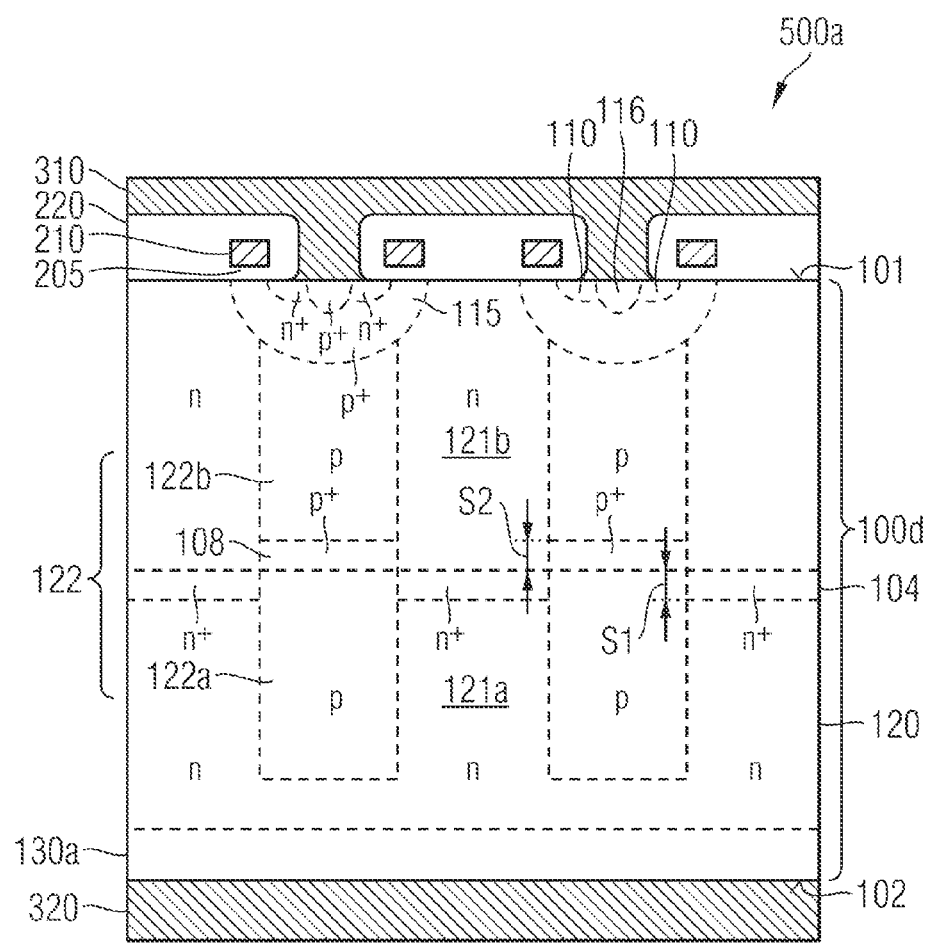
FIG. 1C is a cross-sectional view of the portion of the semiconductor substrate of FIG. 1B after providing first and second electrode structures.

FIGS. 1A to 1C refer to a portion of a semiconductor substrate 500a for the manufacturing of a plurality of identical semiconductor devices. The semiconductor substrate 500a may include a base substrate 130a. At least a portion of the base substrate 130a is provided from a single-crystalline semiconductor material, for example silicon Si, silicon carbide SiC, germanium Ge, a silicon germanium crystal SiGe, gallium nitride GaN or gallium arsenide GaAs. The thickness of the base substrate 130a may be at least 50 μm. The base substrate 130a may be an intrinsic substrate or heavily n-doped or heavily p-doped. On a process surface 131a of the base substrate 130a a first semiconductor layer 100a is provided. For example, the first semiconductor layer 100a may be grown by epitaxy on the process surface 131a. With the base substrate 130a being effective as a seed, the first semiconductor layer 100a grows in registry with the base substrate 130a, wherein a crystal lattice of the first semiconductor layer 100a locks into the crystallographic orientations of the base substrate 130a. The first semiconductor layer 100a may be in-situ doped by impurities of a first conductivity type, which may be the same or the opposite conductivity type as that of the base substrate 130a. The impurity concentration in the first semiconductor layer 100a may be in the range from $5 \times 10^{15}$ cm$^{-3}$ to $5 \times 10^{17}$ cm$^{-3}$, by way of example.

In an exposed surface 101a of the first semiconductor layer 100a impurities of the first conductivity type are introduced, for example by an unmasked ion beam implant process, to form an implant layer 104a. For the illustrated example, the first conductivity type is the n-type and a second, opposite conductivity type is the p-type. According to other embodiments, the first conductivity type is the p-type and the second conductivity type is the n-type.

FIG. 1A shows the n$^+$ doped first implant layer 104a formed along the exposed surface 101a of the n-doped first semiconductor layer 100a, which is grown by epitaxy on the base substrate 130a. A second semiconductor layer 100b is provided on the exposed surface 101a of the first semiconductor layer 100a. Super junction trenches 190 are introduced from an exposed first surface 101 of the second semiconductor layer 100b through the second semiconductor layer 100b into the first semiconductor layer 100a, for example by using a reactive ion beam etch process.

The super junction trenches 190 shown in FIG. 1B may be stripe-shaped grooves extending in a direction perpendicular to the cross-sectional plane. According to other embodiments, the cross-sectional areas of the super junction trenches 190 are rotational symmetric. For example, the cross-sectional areas may be circles, ellipsoids, squares or hexagons, with or without rounded corners. The super junction trenches 190 intersect the implant layer 104a such that segments of the implant layer 104a are formed between neighboring super junction trenches 190 in a vertical first section S1 of the resulting super junction structure.

Implant zones 108a of the second conductivity type may be formed in a vertical second section S2 of the super junction region directly adjoining the vertical first section S1. According to the illustrated embodiment, an end portion of the super junction trenches 190 oriented to the base substrate 130a is filled with a semiconductor material of the second conductivity type to form a fill portion 106a. The semiconductor material may be in-situ doped single-crystalline silicon of the second conductivity type. Impurities of the second conductivity type are introduced into an exposed process surface 101b of the fill portion 106a to form implanted zones 108a of the second conductivity type. A remaining portion of the super junction trenches 190 is filled with further single crystalline semiconductor material having the second conductivity type.

Portions of the first and second semiconductor layers 100a, 100b between the super junction trenches 190 form first columns 121 of a super junction structure. The semiconductor material filling the super junction trenches 190 forms second columns 122 of the super junction structure. The first columns 121 have the first conductivity type and the second columns 122 have the second conductivity type.

After diffusion of the implanted impurities induced by process steps applying thermal energy, first overcompensation zones 104 of the first conductivity type are formed from the implanted layer 104a and second overcompensation zones 108 of the second conductivity type are formed from the implanted zones 108a. In the vertical first section S1 of the super junction structure, the impurities of the first conductivity type in the first overcompensation zones 104 strongly over-compensate the impurities of the second conductivity type in a corresponding vertical section of the second columns 122. The impurities of the second conductivity type in the second overcompensation zones 108 strongly over-compensate the impurities of the first conductivity type in the second section S2 of the super junction structure. The first and the second sections S1, S2 of the super junction structure directly adjoin to each other. According to an embodiment, the second overcompensation zones 108 are closer to the first surface 101 of the second semiconductor layer 100b than the first overcompensation zones 104.

Body zones 115 of the second conductivity type may be formed by introducing impurities from the first surface 101 in the vertical projection of the second columns 122. Source zones 110 of the first conductivity type may be formed by ion beam implantation between the first surface 101 and the body zones 115. Between neighboring source zones 110, a heavily p-doped contact zone 116 may be provided between the first surface 101 and the body zone 115 to ensure a low-ohmic electrical connection to the body zone 115. Gate dielectrics 205 may be formed at least in portions of the first surface 101 directly adjoining the body zones 115. The gate dielectrics 205 may be provided from thermally grown semiconductor oxide, for example silicon oxide or a deposited dielectric, e.g. deposited silicon oxide. A conductive material, for example heavily doped polycrystalline silicon may be deposited and patterned to form gate electrodes 210 above the body zones 115. A dielectric layer 220 may be deposited to encapsulate the gate electrode 210. The dielectric layer 220 is opened in the vertical projection of the second columns 122 to expose the source zones 110 and the contact zones 116. A further conductive material is deposited and patterned to form a first electrode structure 310 electrically connected with the source zones 110 and the contact zones 116. A second electrode structure 320 may be provided on a second surface 102 which is opposite to the first surface 101.

FIG. 1C shows a semiconductor substrate 500a with the base substrate 130a, the first semiconductor layer 100a and the second semiconductor layer 100b forming a composite semiconductor body 100d. In a drift region 120, which may include portions in the first and second semiconductor layers 100a, 100b, a super junction structure is formed that has a vertical extension perpendicular to the parallel first and second surfaces 101, 102 of the composite semiconductor body 100d. Along the vertical extension the first section S1 includes the first overcompensation zones 104. Directly adjoining to the first section S1, the second section S2 includes the second overcompensation zones 108. The second section S2 is closer to the first surface 101 than the first section S1. Both the first and second sections S1, S2 are arranged in a central section of the super junction structure as regards the vertical extension. The first and second columns 121, 122 of the super junction structure have straight sidewalls that may extend along the vertical direction or that may be tilted to the vertical direction. Then the semiconductor substrate 500a may be sawn, broken or cut by a laser beam or an etch process such that a plurality of identical semiconductor dies is obtained from the semiconductor substrate 500a.

Figure 2A:
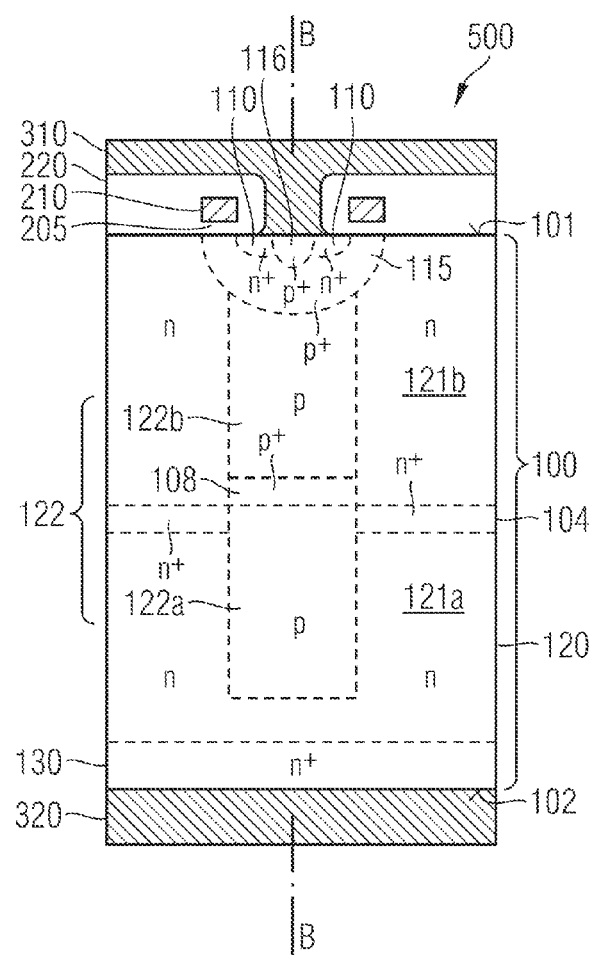
FIG. 2A is a schematic cross-sectional view of a portion of a semiconductor device in accordance with an embodiment providing first overcompensation zones in first columns and second overcompensation zones in second columns.

FIG. 2A shows a super junction semiconductor device 500 based on a semiconductor die obtained by the method illustrated in FIGS. 1A to 1C. The semiconductor device 500 includes a semiconductor portion 100 with a first surface 101 and a second surface 102 parallel to the first surface 101. The semiconductor portion 100 is provided from a single-crystalline semiconductor material, for example silicon Si, silicon carbide SiC, germanium Ge, a silicon germanium crystal SiGe, gallium nitride GaN or gallium arsenide GaAs. A distance between the first and second surfaces 101, 102 is at least 50 µm, for example at least 175 µm. The semiconductor body 100 may have a rectangular shape with an edge length in the range of several millimeters. The normal to the first and second surfaces 101, 102 defines a vertical direction and directions orthogonal to the normal direction are lateral directions.

The semiconductor portion 100 includes an impurity layer 130 of a first conductivity type. The impurity layer 130 may extend along a complete cross-sectional plane of the semiconductor body 100 parallel to the second surface 102. In case the semiconductor device 500 is an IGFET (insulated gate field effect transistor), the impurity layer 130 is a drain layer directly adjoining the second surface 102 and a mean net impurity concentration in the impurity layer 130 is comparatively high, e.g. at least $5 \times 10^{18}$ cm$^{-3}$. In case the semiconductor device 500 is an IGBT (insulated gate bipolar transistor), a collector layer of a second conductivity type is arranged between the impurity layer 130 and the second surface 102 and a mean net impurity concentration in the impurity layer 130 is lower than $5 \times 10^{18}$ cm$^{-3}$.

A drift layer 120 is between the first surface 101 and the impurity layer 130. The drift layer 120 includes a super junction structure with first columns 121 of the first conductivity type and second columns 122 of the second conductivity type. The second columns 122 may directly adjoin the impurity layer 130. According to other embodiments, the second columns 122 are arranged at a distance to the impurity layer 130 such that the drift layer 120 includes a continuous portion of the first conductivity type extending between the buried edges of the first and second columns 121, 122 on the one hand and the impurity layer 130 on the other hand. The first and second columns 121, 122 may directly adjoin to each other. According to another embodiment, a dielectric liner may separate the first and second columns 121, 122 at least along the vertical direction.

The first and second columns 121, 122 may be parallel stripes arranged at regular distances. According to other embodiments, the cross-sectional areas of the second columns 122 parallel to the first surface 101 may be circles, ellipsoids, ovals or rectangles, e.g. squares or hexagons with or without rounded corners, whereby the first columns 121 are segments of a grid embedding the second columns 122.

The semiconductor body 100 further includes body zones 115 of the second conductivity type. Each body zone 115 is structurally and electrically connected to one of the second columns 122 and is arranged in the vertical projection of the respective second column 122 between the first surface 101 and the respective second column 122.

Source zones 110 of the first conductivity type may be embedded in the body zones 115 and may directly adjoin the first surface 101. Heavily doped contact zones 116 of the second conductivity type may be provided between the first surface 101 and the body zones 115.

The source zones 110 may be exclusively formed within a cell area and may be absent in an edge area surrounding the cell area of the semiconductor portion 100. The body zones 115 are provided at least in the cell area and may or may not be absent in the edge area.

Gate dielectrics 205 electrically separate gate electrodes 210 and neighboring portions of the body zones 115. A potential applied to the gate electrodes 210 capacitively controls a minority charge carrier distribution in a channel portion of the body zones 115 directly adjoining the gate dielectrics 205 between the source zones 110 and the corresponding first columns 121 such that in a conductive mode (on-state) of the semiconductor device 500 an on-state current flows through the body zones 115 and the drift layer 120 between the source zones 110 and the impurity layer 130.

The gate electrodes 210 may be arranged above the first surface 101. Other embodiments may provide the gate electrodes 210 in gate trenches introduced in the vertical projection of the first columns 121 such that the gate electrodes 210 are buried in the gate trenches that extend from the first surface 101 into the semiconductor portion 100.

A first electrode structure 310 may be electrically connected to the source zones 110 and the body zones 115 through openings in a dielectric layer 220 covering the gate electrodes 210. The openings in the dielectric layer 220 are formed between neighboring gate electrodes 210. The contact zones 116 of the second conductivity type ensure a low-ohmic electric connection between the first electrode structure 310 and the body zones 115. The dielectric layer 220 electrically insulates the first electrode structure 310 from the gate electrodes 210.

A second electrode structure 320 directly adjoins the second surface 102 of the semiconductor portion 100. According to embodiments related to super junction IGFETs, the second electrode structure 320 directly adjoins the impurity layer 130. According to embodiments related to super junction IGBTs, a collector layer of the second conductivity type may be formed between the impurity layer 130 and the second electrode structure 320.

Each of the first and second electrode structures 310, 320 may consist of or contain, as main constituent(s) aluminum Al, copper Cu, or alloys of aluminum or copper, for example AlSi, AlCu or AlSiCu. According to other embodiments, one or both of the first and second electrode structures 310, 320 may contain, as main constituent(s), nickel Ni, titanium Ti, silver Ag, gold Au, platinum Pt and/or palladium Pd. For example, at least one of the first and second electrode structures 310, 320 includes two or more sub-layers, each sub-layer containing one or more of Ni, Ti, Ag, Au, Pt, and Pd as main constituent(s), e.g. silicides and/or alloys.

According to the illustrated embodiment, the first conductivity type is the n-type, the second conductivity type is the p-type, the first electrode structure 310 is a source electrode and the second electrode structure 320 is a drain electrode. According to other embodiments, the first conductivity type is the p-type.

The interfaces between the first and second columns 121, 122 result from a trench etch and are straight and non-undulated. According to an embodiment referring to stripe-shaped columns, the interfaces between the first and second columns 121, 122 are planar (plane) surfaces. The sidewalls of the second columns 122 may taper with increasing distance to the first surface 101. According to the illustrated embodiment, the interfaces between the first and second columns 121, 122 are parallel to the vertical direction.

Along the vertical direction, the super junction structure including the first and second columns 121, 122 has a first end section E1 oriented to the first surface 101 and a second end section E2 oriented to the second surface 102. In both the first and the second end sections E1, E2 impurities in the corresponding sections of the first and second columns 121, 122 may perfectly or approximately compensate each other. A compensation rate for a vertical section along the vertical extension of the columns 121, 122 may be defined by a difference between the quantity of impurities of the second conductivity type in the first columns 121 and the quantity of impurities of the first conductivity type in the second columns 122 in the concerned vertical section related to the greater amount of both values. For perfect compensation, the quantities related to an arbitrary section of the vertical extension are equal and the compensation rate in this section is equal 0. With the first conductivity type being the n-type and the second conductivity type being the p-type, the compensation rate is 0.5 when the quantity of p impurities in a section of the second columns 122 is twice the quantity of n impurities in a corresponding section of the first columns 121. The compensation rate is −0.5 when the quantity of p impurities in a section of the second columns 122 is half the quantity of n impurities in the corresponding section of the first columns 121. For the illustrated embodiment with equal cross-sectional areas of the first and second columns 121, 122, the compensation rate is defined by the respective impurity concentrations.

In a central section of the super junction semiconductor device between the two end sections E1, E2, a first section S1 of the super junction structure has an excess of impurities of the first conductivity type and a second section S2 which directly adjoins the first section S1 and which is closer to the first surface 101, the super junction structure has an excess of impurities of the second conductivity type.

According to an embodiment, first overcompensation zones 104 of the first conductivity type are formed in the first columns 121 between the two vertical ends of the first columns 121. Each first overcompensation zone 104 may extend over at least a portion of the cross-sectional area of the respective first column 121. According to other embodiments, the first overcompensation zones 104 do not extend over the complete cross-sectional areas of the first columns 121. The maximum net impurity concentration in the first overcompensation zones 104 is a least ten times the maximum net impurity concentration in two end portions 121a, 121b of the first columns 121 outside the first overcompensation zones 104.

In the second section S2 of the super junction structure, second overcompensation zones 108 of the second conductivity type may be formed. The second overcompensation zones 108 may be formed in the first columns 121, the second columns 122, or in both. According to the illustrated embodiment, the second overcompensation zones 108 are formed exclusively within the second columns 122. A maximum net impurity concentration in the second overcompensation zones 108 may be at least ten times the maximum net impurity concentration in the two end portions 122a, 122b of the second columns 122 outside the second overcompensation zones 108.

According to an embodiment, the amount of the compensation rate in both the first and second sections S1, S2 is at least 0.1 such that a peak area, where the electric field strength is sufficiently high to generate charge carriers in case an avalanche mechanism has been triggered, is sufficiently small to restrict the number of generated charge carriers and to ensure that the voltage across the semiconductor device 500 does not immediately break down. The amount of the compensation rate in both the first and second sections is at most 0.5 such that in the reverse mode the semiconductor device 500 can accommodate a sufficiently high breakthrough voltage.

Figure 2B:
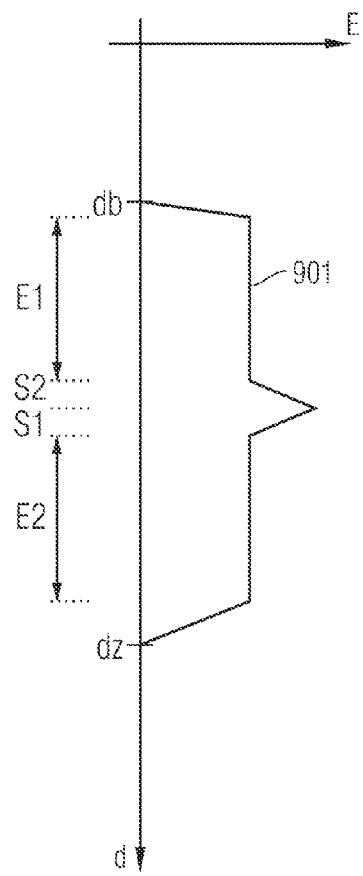
FIG. 2B is a schematic diagram illustrating the electric field profile in the semiconductor device of FIG. 2A in a vertical direction along line B-B.

FIG. 2B shows an electrical field profile 901 of the semiconductor device of FIG. 2A along the central vertical axis of a second column 122 in case a reverse voltage is applied and the avalanche mechanism has not been triggered. In substance, the electric field extends between the heavily doped impurity layer 130 at a distance dz to the first surface 101 and the buried edge of the body zone 115 at a distance db. The slope of the electric field strength depends on the compensation rate and is high where the compensation rate is high, low where the compensation rate is low and 0 in case of perfect compensation where the compensation rate is 0.

The electric field profile (distribution) shows a sharp peak at the interface between the first and the second sections S1, S2. In case an avalanche mechanism has been triggered, the peak concentrates the charge carrier generation in a comparatively narrow portion of the drift zone 120. The number of generated charge carriers as a function of the applied reverse voltage is reduced and a current threshold for TRAPATT (trapped plasma avalanche triggered transit) oscillation is increased. Outside the first and second sections S1, S2, the electric field profile may be flat (constant) or may steadily increase in the second section S2 and/or steadily decrease in the first section S1.

Figure 3:
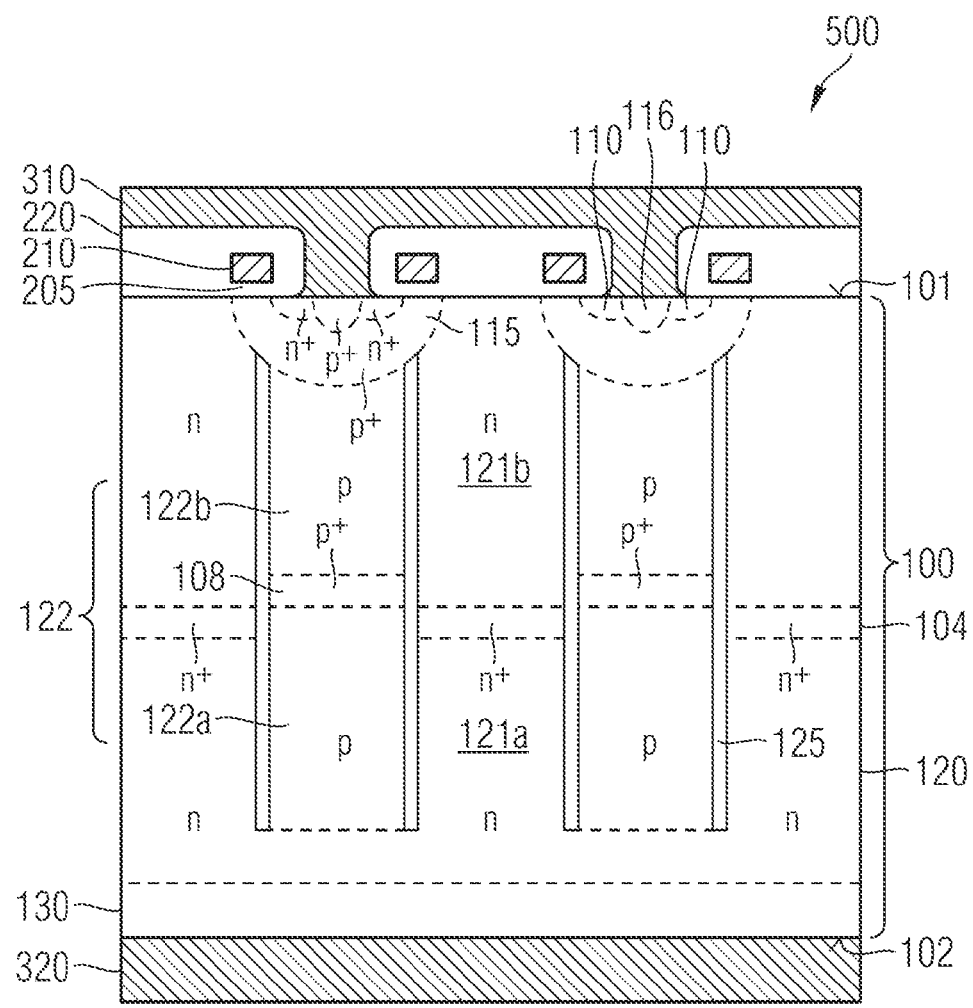
FIG. 3 is a schematic cross-sectional view of a portion of a super junction semiconductor device in accordance with an embodiment providing a dielectric liner between the first and second columns of a super junction region.

The embodiment of FIG. 3 provides a dielectric liner 125 extending along the interfaces between the first columns 121 and the second columns 122. The dielectric liner 125 may consist of or include a thermally grown semiconductor oxide or nitride, for example silicon oxide or silicon nitride. In addition or alternatively, the dielectric liner 125 may include a deposited dielectric material, for example silicon oxide generated using TEOS (tetraethylorthosilane) as precursor material. The dielectric liner 125 reduces the outdiffusion of impurities such that the first columns 121 can be provided at a higher pitch (lower distance) to each other and a lower on-state resistance can be achieved. In addition, with the dielectric liner 125 the trenches can be filled by a selective epitaxial growth starting from the bottom of the trenches.

Figure 4C:
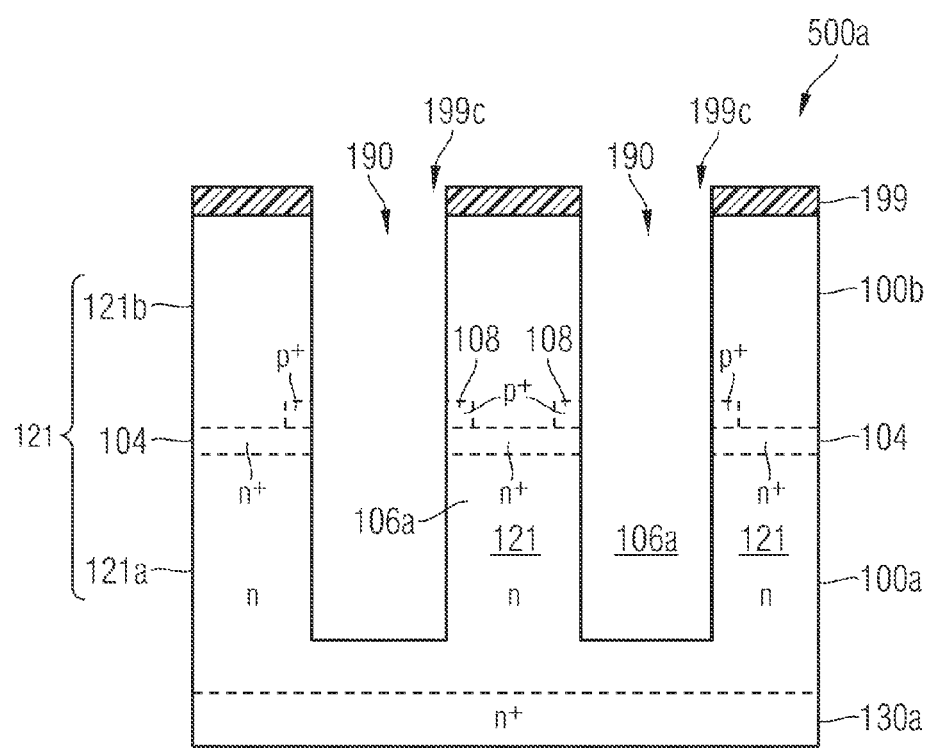
FIG. 4C is a schematic cross-sectional view of the portion of the semiconductor substrate of FIG. 4B after introducing super junction trenches.

FIGS. 4A to 4C refer to a method of providing both types of overcompensation zones within the same columns. A first semiconductor layer 100a is provided on a process surface 131a of a base substrate 130a, for example by an epitaxy process. The base substrate 130a may consist of or include a single-crystalline semiconductor material, for example silicon Si, silicon carbide SiC, germanium Ge, a silicon germanium crystal SiGe, gallium nitride GaN or gallium arsenide GaAs. The base substrate 130a may be an intrinsic, heavily n-doped or heavily p-doped substrate. According to the illustrated embodiment, the base substrate 130a is heavily n-doped. The first semiconductor layer 100a may be in-situ doped and may have an impurity concentration of a first conductivity type, which may be the n-type, in a range from $5 \times 10^{15}$ cm$^{-3}$ to $5 \times 10^{17}$ cm$^{-3}$. In an exposed surface 101a of the first semiconductor layer 100a impurities of the first conductivity type are introduced, for example using an unmasked ion beam implant process.

FIG. 4A shows an n+-doped implant layer 104a along the exposed surface 101a of the n-doped first semiconductor layer 100a. The implant layer 104a may be formed close to the exposed surface 101a or at a distance to the exposed surface 101a.

According to an embodiment, the implant layer 104a is formed at a distance to the exposed surface 101a and between the exposed surface 101a and the implant layer 104a impurities of the second impurity type are implanted into sections of the exposed surface 101a to form spatially separated implant zones 108a at a lower implant energy than for implanting the impurities of the first impurity type into the exposed surface 101a. Then a second semiconductor layer 100b is provided on the exposed surface 101a.

According to another embodiment, a first sub-portion 100x of a second semiconductor layer 100b is provided on the exposed surface 101a of the first semiconductor layer 100a. An implant mask 198 is provided on the auxiliary process surface 101b of the first sub-portion 100x and patterned by photolithographic means to form an implant mask 198 with segments 198a, 198b. The segments 198a are optional. Impurities of the second conductivity type are introduced into such sections of the auxiliary process surface 101b that the implant mask 198 exposes.

FIG. 4B shows the first sub-portion 100x of the second semiconductor layer 100b provided on the first semiconductor layer 100a and a patterned implant mask 198 with openings 198c. Implant zones 108a are formed in portions of the first sub-portion 100x exposed by the openings 198c. A remaining sub-portion of the second semiconductor layer 100b is provided on the auxiliary process surface 101b, for example grown by epitaxy and super junction trenches 190 are etched from an exposed surface 101a of the second semiconductor layer 100b through the second semiconductor layer 100b into the first semiconductor layer 100a using a patterned etch mask 199.

According to FIG. 4C, the super junction trenches 190 have approximately vertical sidewalls oriented perpendicular to the exposed first surface 101 of the second semiconductor layer 100b. The super junction trenches 190 are aligned to the openings 198c of the implant mask 198 of FIG. 4B. From the implant layer 104a of FIG. 4B, first overcompensation zones 104 and from the implanted zones 108a second overcompensation zones 108 emerge by diffusion induced by thermal treatments applied in the course of providing the second semiconductor layer 100b, by way of example.

Openings 199c in the trench mask 199 are aligned to the openings 198c of the implant mask 198 of FIG. 4B such that the second overcompensation zones 108 do not extend over the complete cross-sectional area of the first columns 121.

The second overcompensation zones 108 may be patterned in a lateral direction parallel to the cross-sectional plane. According to an embodiment one single second overcompensation zone 108 is formed in each first column 121. According to other embodiments two or more spatially separated second overcompensation zones 108 are formed in each first column 121. The spatially separated second overcompensation zones 108 may directly adjoin the super junction trenches 190 or may be spaced from the super junction trenches 190. The super junction trenches 190 may be filled with a semiconductor material of the second conductivity type to form second columns 122 of the second conductivity type. The processing may be continued as described with respect to FIG. 1C.

Figure 5A:
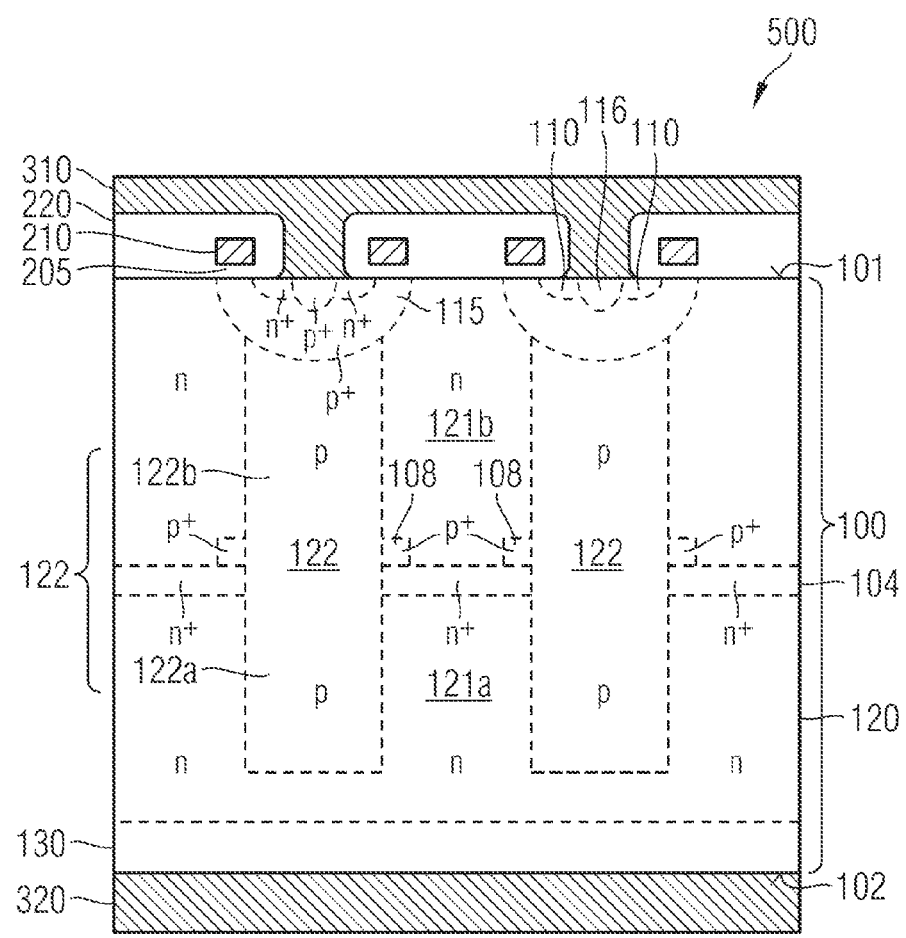
FIG. 5A is a schematic cross-sectional view of a portion of a semiconductor device in accordance with an embodiment providing surface gate electrodes, first and second overcompensation zones in the same columns and spatially separated second overcompensation zones formed along the pn-junctions.

A semiconductor device 500 of FIG. 5A, which may result from the process illustrated in FIGS. 4A to 4C, shows second overcompensation zones 108 formed in the first columns 121 directly adjoining to first overcompensation zones 104 of the first conductivity type. The second columns 122 are homogeneously doped. The second overcompensation zones 108 are absent in the second columns 122. The embodiment provides a continuous, un-intercepted fill of the super junction trenches 190 for providing the second columns 122. The second overcompensation zones 108 are provided in the first columns 121 along the interfaces to the second columns 122 and are absent in a central portion of the first columns 121 such that on-state current characteristics of the semiconductor device 500 are hardly adversely affected.

Figure 5B:
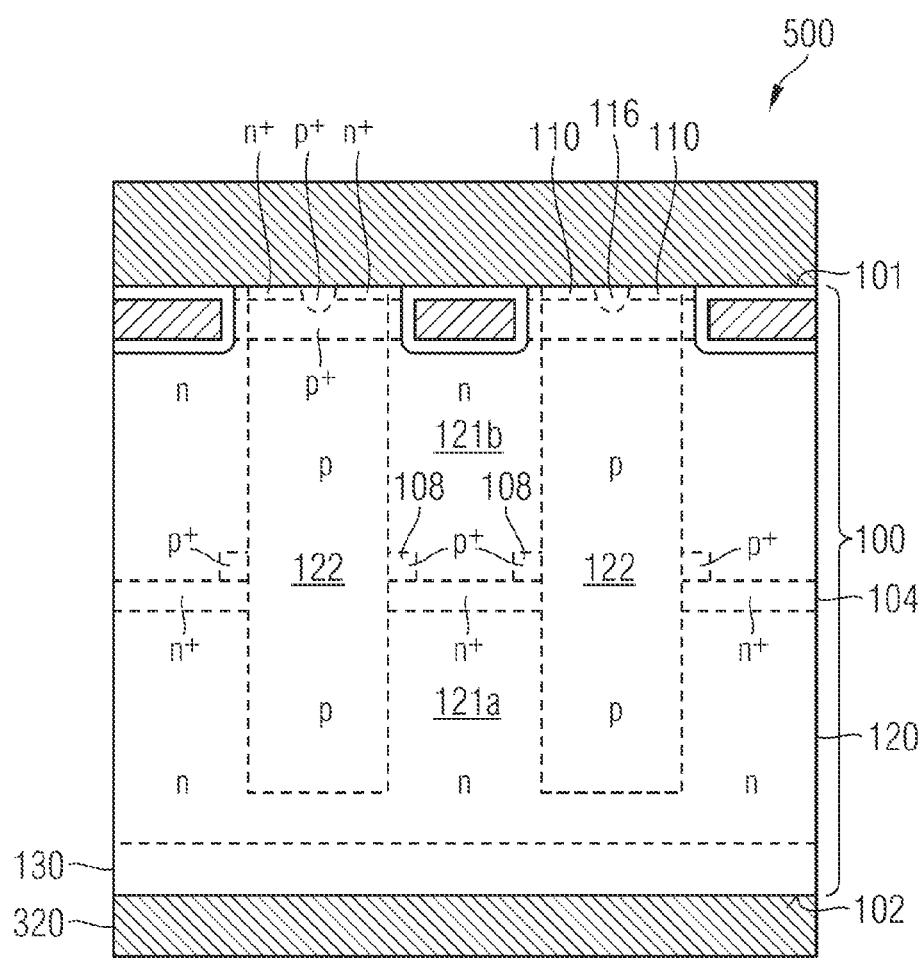
FIG. 5B is a schematic cross-sectional view of a portion of a semiconductor device in accordance with an embodiment providing buried gate electrodes, first and second overcompensation zones in the same columns spatially separated second overcompensation zones along the pn-junctions.

The embodiment of FIG. 5B provides buried gate electrodes 210 instead of the surface gate electrodes 210 of FIG. 5A.

Figure 5C:
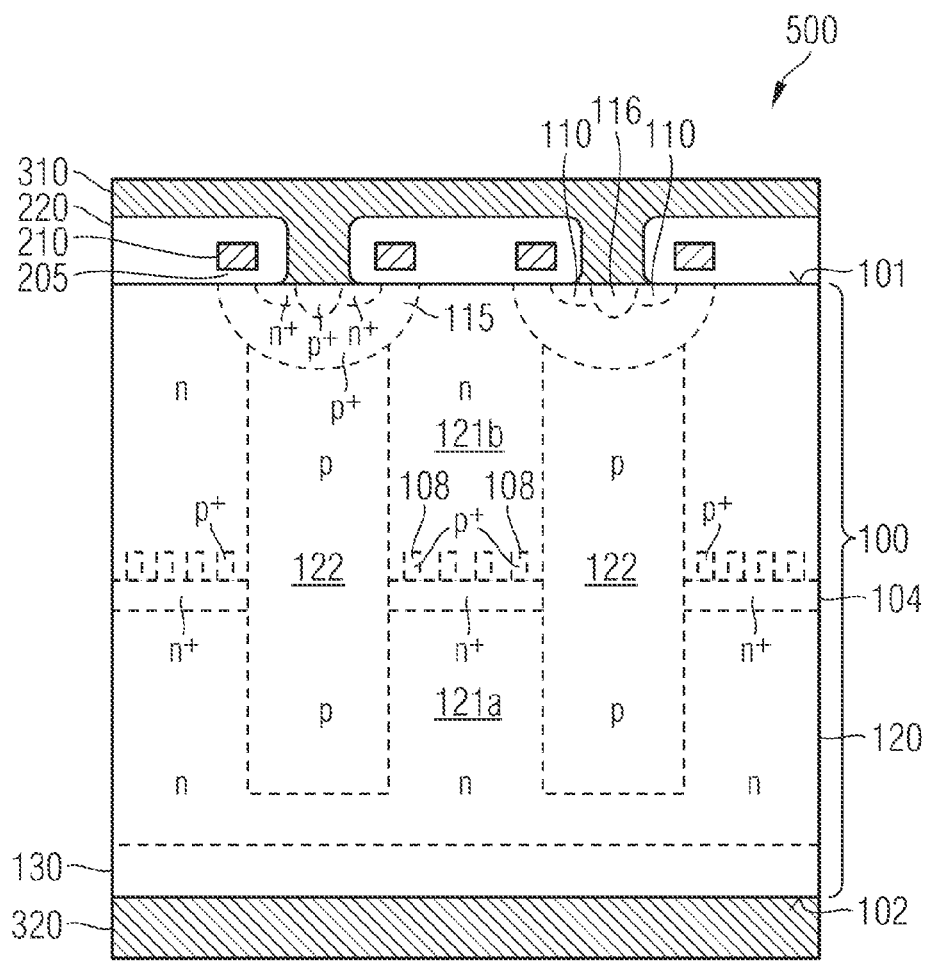
FIG. 5C is a schematic cross-sectional view of a portion of a semiconductor device in accordance with an embodiment providing spatially separated second overcompensation zones spaced from the pn-junction.

FIG. 5C shows an embodiment providing a plurality of segmented second overcompensation zones 108 in each first column 121 supporting a more precise adjustment of the impurity concentrations and impurity profiles.

The embodiment of FIG. 6A differs from the embodiment of FIG. 2A in that first end portions 122b of the second columns 122 oriented to the first surface 101 have a higher net impurity concentration than second end portions 122a oriented to the second surface 102. The first end portions 122b extend between the body zones 115 and the second overcompensation zones 108. The second end portions 122a extend between the second overcompensation zones 108 and the end of the second columns 122 oriented to the second surface 102. According to an embodiment, the impurity concentrations are such that a compensation rate in the first end portion 122b is slightly positive and the impurities of the second conductivity type slightly predominate the impurities of the first conductivity type in the corresponding vertical section of the super junction structure and a compensation rate in the second end portion 122a is slightly negative and the impurities of the first conductivity type slightly predominate the impurities of the second conductivity type in the corresponding vertical section of the super junction structure. The first and second end portions 121b, 121a of the first columns may have different net impurity concentrations of the same net impurity concentrations.

In the depletion state, both electrons and holes generated in the avalanche in a region close to the overcompensation zones 104, 108 have a stabilizing effect, since both flow from the place of generation into areas in which they compensate for the predominating excess charge of the immobile charge carriers. As a consequence there is a continuous stability range from p-loaded to n-loaded compensation rates. This approach can be easily combined with the formation of the overcompensation zones since an epitaxy process applying graded in-situ doping is interrupted at the same position for performing the implants for the overcompensation zones 104, 108.

Figure 6B:
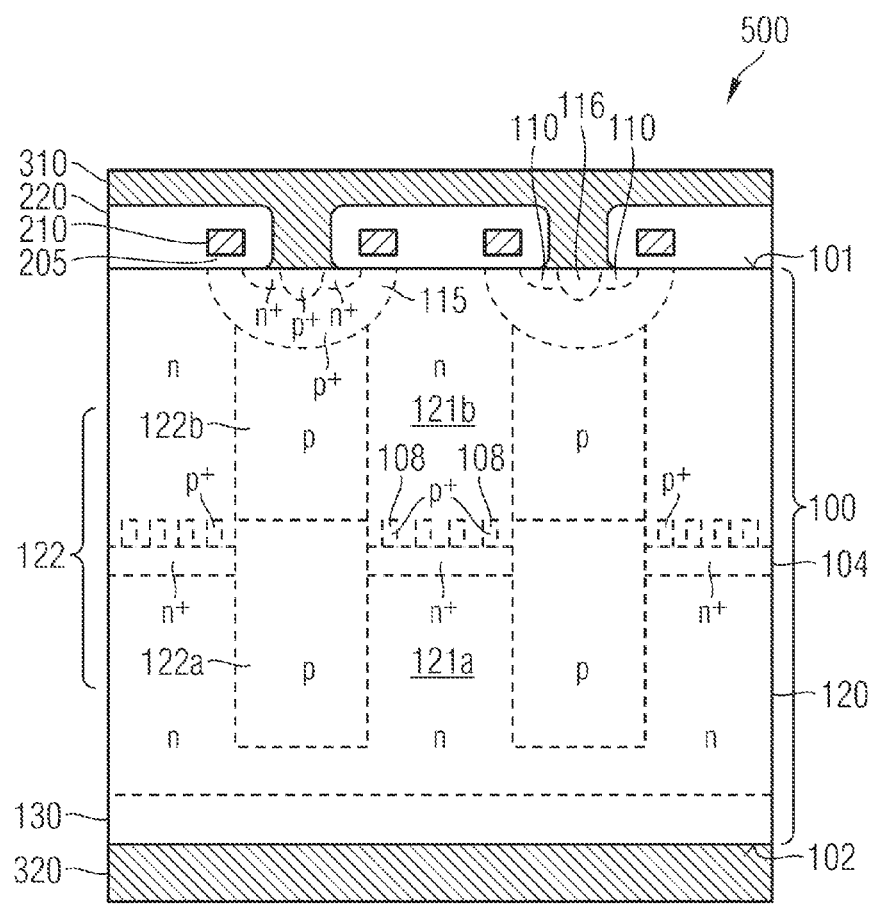
FIG. 6B is a cross-sectional view of a portion of a semiconductor device in accordance with an embodiment providing first and second overcompensation zones directly adjoining to each other in the same columns and super junction sections of different compensation rates.

FIG. 6B shows a semiconductor device 500 that combines a higher doped first end portion 122b and a lower doped second end portion 122a of the second columns 122 with the embodiment of FIG. 5C. The sign of the compensation rate may be positive for the first end portions 122b and negative for the second end portions 122a.

Figure 6C:
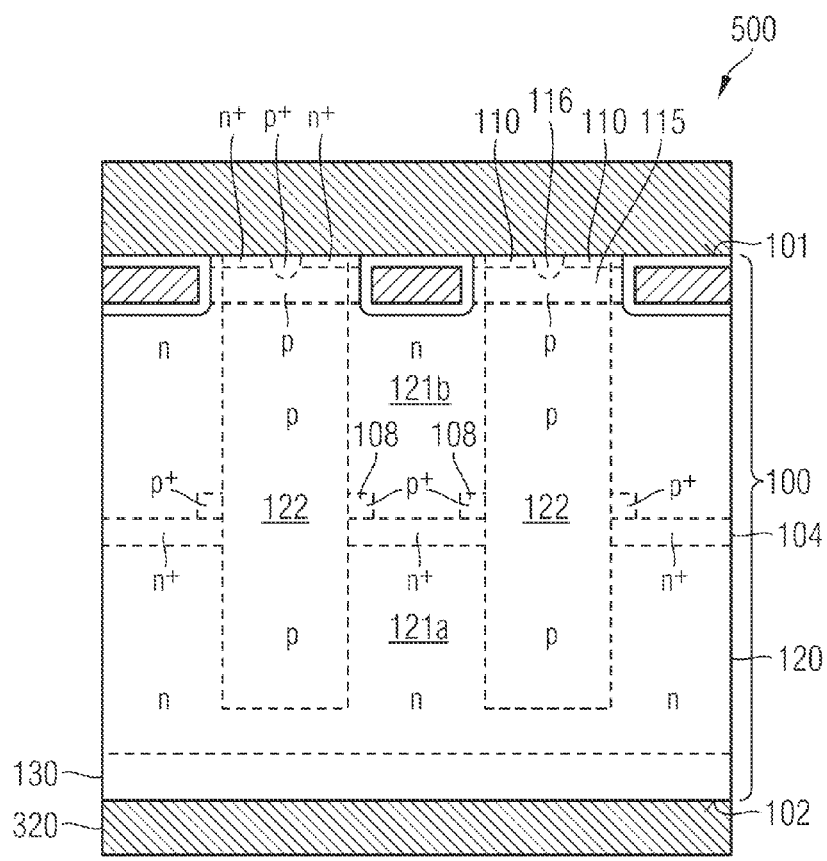
FIG. 6C is a schematic cross-sectional view of a portion of a semiconductor device in accordance with an embodiment providing first and second overcompensation zones directly adjoining to each other in the same columns and adjoining to pn-junctions of the super junction structure.

The semiconductor device 500 of FIG. 6C in substance corresponds to the semiconductor device 500 of FIG. 5A with homogenously doped second columns 122 and with first columns 121 whose first end portions 121b oriented to the first surface 101 having a lower net impurity concentration than second end portions 121a oriented to the second surface 102. The sign of the compensation rate may be positive for the first end portions 122b and negative for the second end portions 122a.

A method of manufacturing a super junction semiconductor device illustrated in FIG. 7 includes introducing impurities of a first impurity type into a process surface of a first semiconductor layer of the first impurity type (702), wherein an implant layer is formed. A second semiconductor layer of the first impurity type is provided on the process surface (704). Trenches are etched through the second semiconductor layer into the first semiconductor layer, wherein between the trenches first columns with first overcompensation zones obtained from the implant layer are formed (706). Second columns of the second conductivity type are provided in the trenches, wherein the first and second columns form a super junction structure with a vertical first section in which the first overcompensation zones overcompensate a corresponding section in the second columns (708).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A super junction semiconductor device, comprising:
a super junction structure comprising first columns of a first conductivity type and second columns of a second conductivity type opposite to the first conductivity type, the second columns separating the neighboring first columns from each other and extending in a vertical direction perpendicular to a first surface of a semiconductor body,
wherein the first columns have non-undulated sidewalls, and the impurities of the first conductivity type in first overcompensation zones overcompensate the impurities of the second conductivity type in a vertical first section of the super junction structure.

2. The super junction semiconductor device according to claim 1, wherein the first section of the super junction region structure has an excess of impurities of the first conductivity type.

3. The super junction semiconductor device according to claim 1, wherein sidewalls of the first columns extend perpendicular to the first surface.

4. The super junction semiconductor device according to claim 1, wherein the first overcompensation zones have a mean net impurity concentration of the first conductivity type at least 10 times a maximum net impurity concentration in end portions of the first columns outside the first overcompensation zones.

5. The super junction semiconductor device according to claim 1, wherein in a vertical second section of the super junction structure directly adjoining the first section impurities of the second conductivity type overcompensate impurities of the first conductivity type.

6. The super junction semiconductor device according to claim 5, wherein the second section of the super junction region structure has an excess of impurities of the second conductivity type.

7. The super junction semiconductor device according to claim 5, wherein the first and second sections are in a central third of the super junction structure in relation to a vertical extension of the super junction structure along a vertical direction normal to the first surface.

8. The super junction semiconductor device according to claim 5, wherein an interface between the first and second sections is in a region between 0.4×ch and 0.6×ch, and ch is the vertical extension of the super junction structure.

9. The super junction semiconductor device according to claim 5, wherein the second section is closer to the first surface than the first section.

10. The super junction semiconductor device according to claim 5, wherein in the second section second overcompensation zones are formed in the first columns.

11. The super junction semiconductor device according to claim 5, wherein in the second section second overcompensation zones are formed in the second columns, and a mean net impurity concentration in the second overcompensation zones is at least ten times a mean net impurity concentration in end portions of the second columns outside the second overcompensation zones.

* * * * *